US007619267B2

(12) United States Patent
Araki

(10) Patent No.: US 7,619,267 B2
(45) Date of Patent: Nov. 17, 2009

(54) SOLID-STATE IMAGING DEVICE

(75) Inventor: Yasushi Araki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 89 days.

(21) Appl. No.: 11/655,964

(22) Filed: Jan. 22, 2007

(65) Prior Publication Data

US 2007/0170478 A1      Jul. 26, 2007

(30) Foreign Application Priority Data

Jan. 24, 2006    (JP)    ............................. 2006-015407

(51) Int. Cl.
*H01L 31/113*    (2006.01)
*H01L 31/062*    (2006.01)
(52) U.S. Cl. ...................... 257/292; 257/233; 257/291; 257/294; 257/E27.133; 257/E27.134
(58) Field of Classification Search .................. 358/44; 438/97; 136/243; 257/292, 294, 431, 461, 257/233, 291, E27.133, E27.134, E27.135
See application file for complete search history.

(56) References Cited

U.S. PATENT DOCUMENTS 4,438,455 A * 3/1984 Tabei .......................... 348/280

5,698,892 A * 12/1997 Koizumi et al. ............. 257/620
2005/0022856 A1* 2/2005 Komatsu et al. ............ 136/243

FOREIGN PATENT DOCUMENTS

| JP | 58-103165 A | 6/1983 |
| JP | 2002-83946 A | 3/2002 |
| JP | 3405099 B2 | 7/2003 |

OTHER PUBLICATIONS

Translation of JP 2002083946 A, of record.*

* cited by examiner

*Primary Examiner*—Leonardo Andújar
*Assistant Examiner*—Mamadou Diallo
(74) *Attorney, Agent, or Firm*—Sughrue Mion, PLLC

(57) ABSTRACT

A solid-state imaging device comprising a plurality of pixels arrayed on a plane, wherein each of the pixels includes a semiconductor substrate and a plurality of photoelectric conversion devices, the plurality of photoelectric conversion devices include at least one on-substrate photoelectric conversion device stacked in an upper portion of the semiconductor substrate and at least one in-substrate photoelectric conversion device provided within the semiconductor substrate in a lower portion of the on-substrate photoelectric conversion device, and the plurality of photoelectric conversion devices have a different photoelectric conversion sensitivity from each other.

41 Claims, 6 Drawing Sheets

SOLID-STATE IMAGING DEVICE

FIELD OF THE INVENTION

The present invention relates to a solid-state imaging device having a plurality of pixel arrayed in the same plane.

BACKGROUND OF THE INVENTION

As a prototype of a photoelectric conversion element stack type solid-state imaging device, for example, there are solid-state imaging devices described in JP-A-58-103165, Japanese Patent No. 3405099 and JP-A-2002-83946. Such a solid-state imaging device is configured such that three photosensitive layers are stacked in an upper portion of a semiconductor substrate and that respective red (R), green (G) and blue (B) electric signals detected in the respective photosensitive layers are read out by an MOS circuit formed on a surface of the semiconductor substrate.

Solid-state imaging devices having such a configuration were proposed in the past. Thereafter, a single plate CCD type image sensor or CMOS type image sensor in which not only a number of light receiving parts (photodiodes) are integrated in a surface part of a semiconductor substrate, but also respective R, G and B color filters are stacked on each of the light receiving parts have remarkably progressed. Nowadays, an image sensor in which several millions light receiving parts (pixels) are integrated on one chip is mounted in a digital camera.

SUMMARY OF THE INVENTION

In the CCD type image sensor or CMOS type image sensor, its technical progress becomes close to the limits. Realization of a higher image quality is anticipated rather than an increase of the number of pixels per unit area. However, a size of a light receiving region (aperture) of the smallest light receiving part has broken 2 μm. More microstructural refinement is fraught with difficulty, and at the same time, microstructural refinement with a shorter size than the wavelength of light is actually impossible. Thus, the microstructural refinement will reach its limits in the near future without exception.

Also, when the microstructural refinement progresses, the number of electrons which can be stored per pixel is theoretically reduced, whereby a lowering of a dynamic range is brought. In order to compensate the lowering of the dynamic range brought due to the reduction of the number of stored electrons, there is proposed a method in which one frame period is divided into sub-frame periods, a shutter time is varied by a sub-frame time of each of the sub-frame periods and the obtained signals are synthesized. However, this method requires an amplification circuit of a wide region, and it is very difficult to make it compatible with realization of a wide region following an increase of the number of pixels. From these factors, the existing solid-state imaging devices involved a theoretical problem that it is very difficult to make realization of a wide dynamic range and realization of a high image quality compatible with each other.

Under these circumstances, the invention has been made. An object of the invention is to provide a solid-state imaging device capable of making realization of a wide dynamic range and realization of a high image quality compatible with each other.

The solid-state imaging device of the invention is a solid-state imaging device having a plurality of pixels arrayed on the same plane, wherein each of the pixels includes plural photoelectric conversion devices, the plural photoelectric conversion devices include at least one on-substrate photoelectric conversion device stacked in an upper portion of a semiconductor substrate and at least one in-substrate photoelectric conversion device formed within the semiconductor substrate in a lower portion of the on-substrate photoelectric conversion device, and a sensitivity difference in photoelectric conversion sensitivity is provided among the plural photoelectric conversion devices.

In the solid-state imaging device of the invention, the photoelectric conversion sensitivity of the in-substrate photoelectric conversion device is higher than the photoelectric conversion sensitivity of the on-substrate photoelectric conversion device.

In the solid-state imaging device of the invention, the plural photoelectric conversion devices include at least two on-substrate photoelectric devices, and in the at least two on-substrate photoelectric devices, the on-substrate photoelectric conversion device closer to the semiconductor substrate has lower photoelectric conversion sensitivity.

In the solid-state imaging device of the invention, a wavelength region of light to be detected is different among the plural photoelectric conversion devices.

In the solid-state imaging device of the invention, the plural photoelectric conversion devices are two on-substrate photoelectric conversion devices and one in-substrate photoelectric conversion device, and lights of three red, green and blue wavelength regions are detected by the two on-substrate photoelectric conversion devices and the one in-substrate photoelectric conversion device.

In the solid-state imaging device of the invention, the plurality of pixels are divided into units each made of plural pixels, and the adjacent on-substrate photoelectric conversion devices to each other and the adjacent in-substrate photoelectric conversion devices to each other within the unit detect light of a different wavelength region from each other, respectively.

In the solid-state imaging device of the invention, wavelength regions of lights to be detected by the plural photoelectric conversion devices are the same, the plurality of pixels include a red pixel provided with the plural photoelectric conversion devices for detecting light of a red wavelength region, a green pixel provided with the plural photoelectric conversion devices for detecting light of a green wavelength region, and a blue pixel provided with the plural photoelectric conversion devices for detecting light of a blue wavelength region, and a ratio of the number of the red pixels to the number of the green pixels to the number of the blue pixels is 1/2/1.

In the solid-state imaging device of the invention, the on-substrate photoelectric conversion device is configured to include a photoelectric conversion element, and when the plural photoelectric conversion devices include at least two on-substrate photoelectric conversion devices, in the at least two photoelectric conversion elements contained in the pixel, the photoelectric conversion element closer to the semiconductor substrate has a higher external quantum efficiency.

In the solid-state imaging device of the invention, the on-substrate photoelectric conversion device is configured to include the photoelectric conversion element and one pair of electrodes interposing the photoelectric convention element therebetween.

In the solid-state imaging device of the invention, the on-substrate photoelectric conversion device is configured to include a photoelectric conversion element and one pair of electrodes interposing the photoelectric convention element therebetween.

In the solid-state imaging device of the invention, the photoelectric conversion element contains an organic material.

In the solid-state imaging device of the invention, the organic material contains a hole transporting organic material and an electron transporting organic material.

In the solid-state imaging device of the invention, the hole transporting organic material and the electron transporting organic material are stacked in this order from a side of the semiconductor substrate.

In the solid-state imaging device of the invention, in one pixel, a light receiving area of the in-substrate photoelectric conversion device in top view is 20% or more and not more than 90% of a light receiving area of the on-substrate photoelectric conversion device in top view.

In the solid-state imaging device of the invention, in one pixel, a deviation between a center of a light receiving region of the in-substrate photoelectric conversion device in top view and a center of a light receiving region of the on-substrate photoelectric conversion device in top view is not more than 30% of a width of the light receiving region of the on-substrate photoelectric conversion device.

According to the invention, it is possible to provide a solid-state imaging device capable of making realization of a wide dynamic range and realization of a high image quality compatible with each other.

DETAILED DESCRIPTION OF THE INVENTION

Embodiments of the invention are hereunder described with reference to the accompanying drawings.

Figure 1:
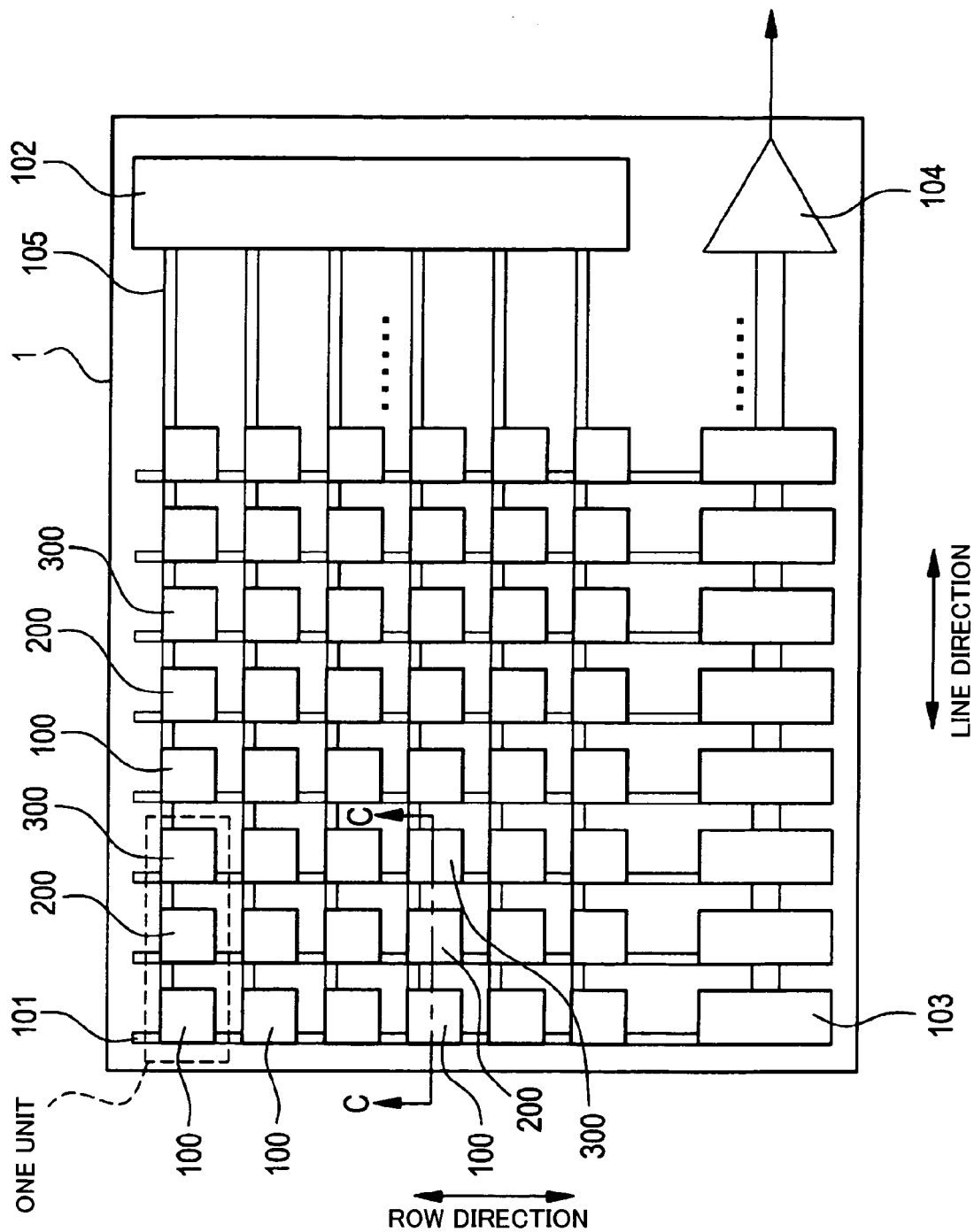
FIG. 1 is a surface schematic view to show a configuration of a solid-state imaging device for explaining an embodiment of the invention.

FIG. 1 is a surface schematic view to show a configuration of a solid-state imaging device for explaining an embodiment of the invention.

A solid-state imaging device as illustrated in FIG. 1 is provided with numerous pixels (a pixel 100, a pixel 200 and a pixel 300) on the same plane. The numerous pixels are arrayed such that a line composed of plural pixels arrayed in a line direction on the same plane is designated as a pixel line; an arrangement in which this pixel line is arrayed in large numbers in a row direction on the same plane, or a row composed of plural pixels arrayed in a row direction is designated as a pixel row; and this pixel row is arrayed in large numbers in a line direction. The numerous pixels are divided into numerous units, with one unit being composed of the pixels 100, 200 and 300 arrayed in the line direction; and one pixel data configuring one pixel of an image can be obtained from each of the numerous units. In other words, the solid-state imaging device as illustrated in FIG. 1 is configured such that numerous units are arrayed in a square lattice state. Incidentally, the array of numerous pixels is not limited to the array as illustrated in FIG. 1. Each pixel includes a photoelectric conversion device for detecting each of R, G and B lights, emitting a signal charge corresponding thereto and storing it; and a signal read-out part for reading out a signal corresponding to the signal charge stored in the photoelectric conversion device.

On an n-type silicon substrate 1, a line-selection scanning part 102 for supplying a driving signal for driving the signal read-out part included in each pixel into the signal read-out part; a column amplifier 103 for executing correlated double sampling processing or amplification processing against a color signal read out from each pixel; and a read-out amplifier 104 for serially executing signal processing against the signal processed in the column amplifier 103 and outputting it are formed.

The signal read-out part of pixels configuring each pixel line and the line-selection scanning part 102 are connected to each other by a signal line 105; and when a driving signal is supplied from the line-selection scanning part 102 into the signal read-out part via the signal line 105, a pixel line which becomes subjective to the signal read-out is selected, whereby a signal read-out action is executed. The signal read-out part of pixels configuring each pixel line and the column amplifier 103 are connected to each other by a signal line 101; and a signal read out from the signal read-out part is transmitted into the column amplifier 103 via the signal line 101.

Figure 2:
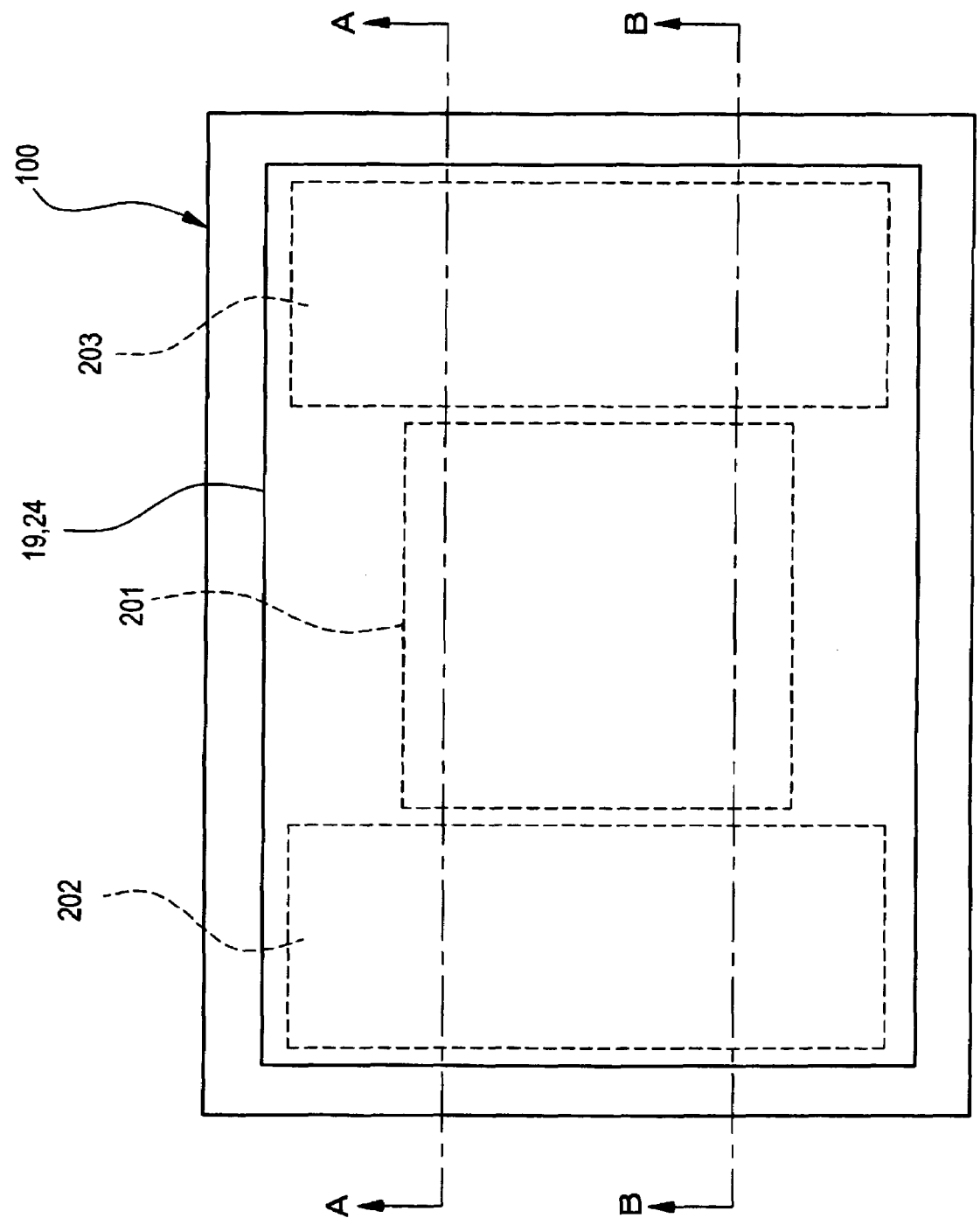
FIG. 2 is a surface schematic view in which one pixel as illustrated in FIG. 1 is enlarged.
Figure 3:
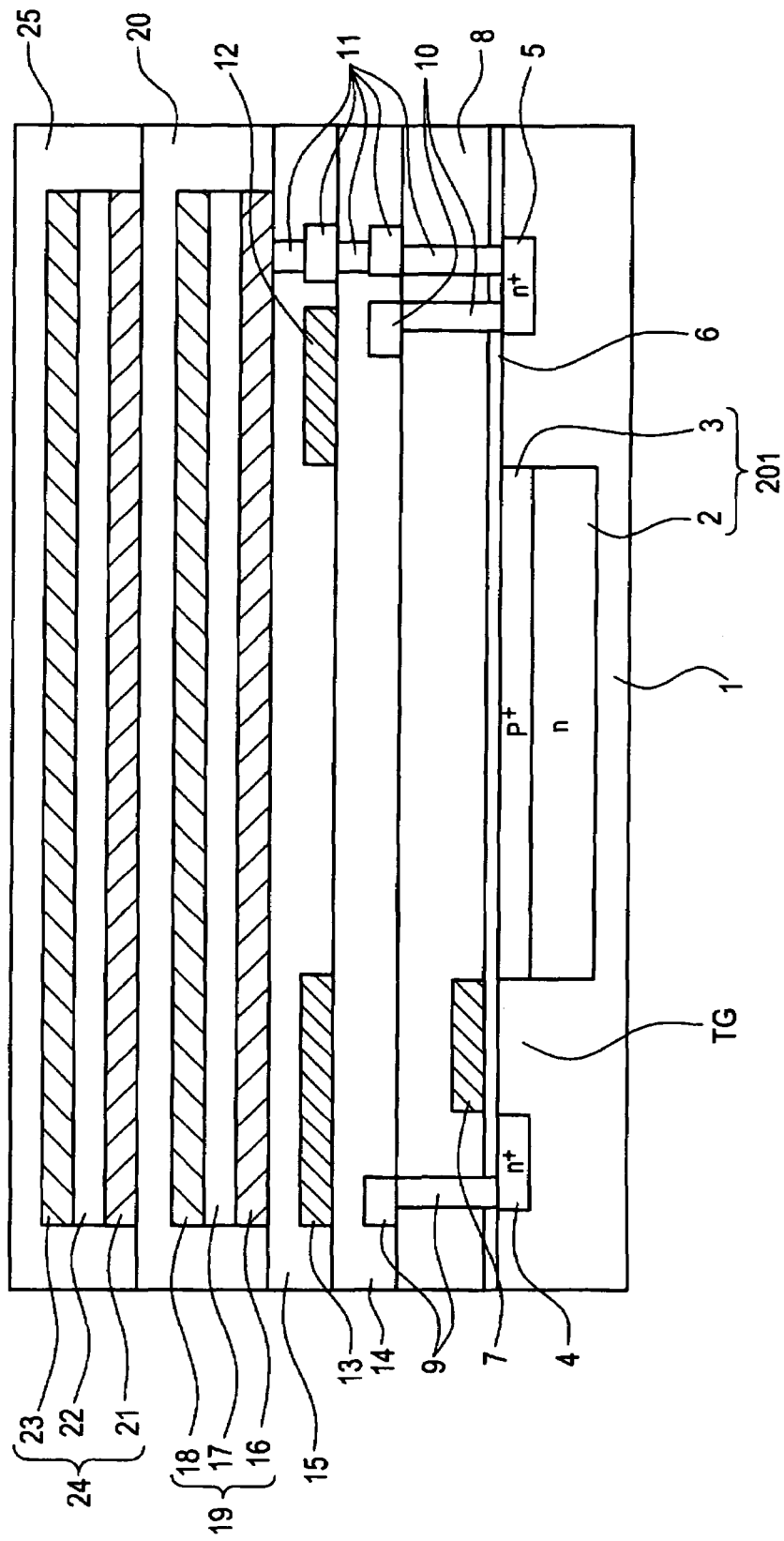
FIG. 3 is an A-A line sectional schematic view of FIG. 2.
Figure 4:
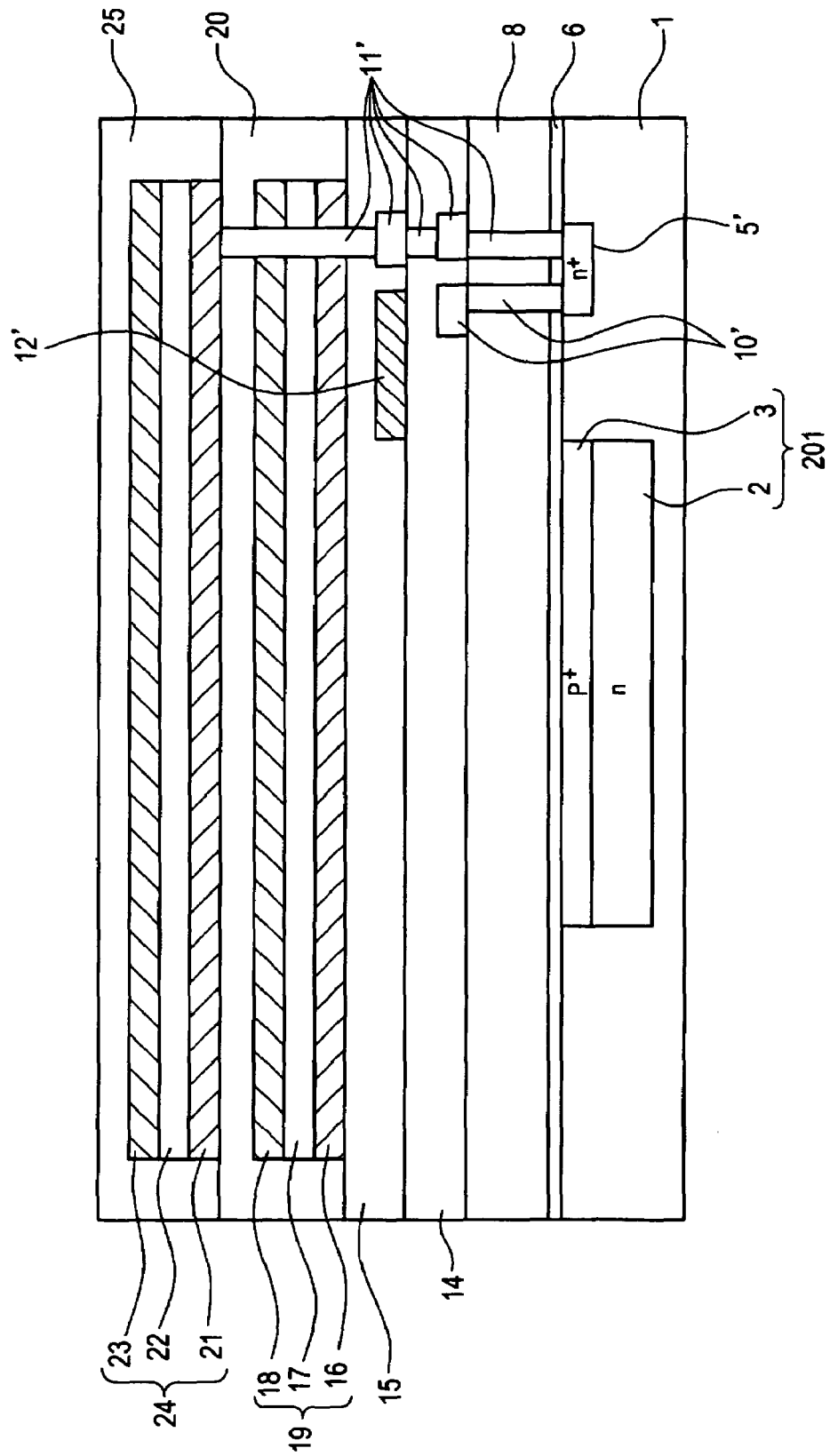
FIG. 4 is a B-B line sectional schematic view of FIG. 2.

FIG. 2 is a surface schematic view in which one pixel 100 as illustrated in FIG. 1 is enlarged. FIG. 3 is an A-A line sectional schematic view of FIG. 2. FIG. 4 is a B-B line sectional schematic view of FIG. 2.

The pixel 100 is provided with an in-substrate photoelectric conversion device 201 formed within the n-type substrate 1; an in-substrate photoelectric conversion device signal read-out part 202 for reading out a signal corresponding to a signal charge obtained by photoelectric conversion by the in-substrate photoelectric conversion device 201 into the signal line 101; two on-substrate photoelectric conversion devices 19 and 24 stacked in an upper portion of the in-substrate photoelectric conversion device 201; and an on-substrate photoelectric conversion device signal read-out part 203 for reading out a signal corresponding to a signal charge obtained by photoelectric conversion by the on-substrate photoelectric conversion devices 19 and 24 into the signal line 101.

As illustrated in FIGS. 3 and 4, a non-illustrated p-well layer is formed in a surface part of the n-type silicon substrate 1; a p$^+$ type impurity layer 3 is formed in a surface part of this p-well layer; and an n-type impurity layer 2 is formed beneath the p+ type impurity layer 3. A known photodiode is configured by the p-well layer, the n-layer 2 and the p$^+$ layer 3; and this photodiode becomes the in-substrate photoelectric conversion device 201. The photoelectric conversion device 201 detects light of a B wavelength region and emits a signal charge corresponding to the quantity of incident B light among incident lights.

In an upper portion of the photoelectric conversion device 201, an on-substrate photoelectric conversion device 19 is formed via a gate dielectric element 6 and transparent dielectric elements 8, 14 and 15. In an upper portion of the on-substrate photoelectric conversion device 19, an on-substrate photoelectric conversion device 24 is formed via a transparent dielectric element 20. A transparent dielectric element 25 is formed on the on-substrate photoelectric conversion device 24.

The photoelectric conversion device 19 is configured such that an pixel electrode element 16 separated for every pixel, a photoelectric conversion element 17 separated for every pixel and a counter electrode element 18 separated for every pixel are stacked in this order from the side of the silicon substrate 1. The counter electrode 18 may be made common over all of the pixels. Each of the pixel electrode element 16 and the counter electrode element 18 may be made of a material which is an optically transparent or less in light absorption. For example, each of the pixel electrode element 16 and the counter electrode element 18 is made of a metallic compound such as ITO or a very thin metallic film. The photoelectric conversion element 17 detects light of an R wavelength region and emits a signal charge corresponding to the quantity of incident R light among incident lights. The structure of the photoelectric conversion element 17 may be of a single-layer structure or a multilayered structure and is made of an inorganic material having sensitivity mainly to R (for example, silicon or compound semiconductors or nano particles thereof), an organic semiconductor material, an organic material or inorganic material containing an organic dye, or the like. By applying a bias voltage between the pixel electrode element 16 and the counter electrode element 18, it is possible to transfer the signal charge generated in the photoelectric conversion element 17 into the pixel electrode element 16 and collect it.

The photoelectric conversion device 24 is configured such that a pixel electrode element 21 separated for every pixel, a photoelectric conversion element 22 separated for every pixel and a counter electrode element 23 separated for every pixel are stacked in this order from the side of the silicon substrate 1. The counter electrode 23 may be made common over all of the pixels. Each of the pixel electrode element 21 and the counter electrode element 23 may be made of a material which is an optically transparent or less in light absorption. For example, each of the pixel electrode element 21 and the counter electrode element 23 is made of a metallic compound such as ITO or a very thin metallic film. The photoelectric conversion element 22 detects light of an G wavelength region and emits a signal charge corresponding to the quantity of incident G light among incident lights. The structure of the photoelectric conversion element 22 may be of a single-layer structure or a multilayered structure and is made of an inorganic material having sensitivity mainly to G (for example, silicon or compound semiconductors or nano particles thereof), an organic semiconductor material, an organic material or inorganic material containing an organic dye, or the like. By applying a bias voltage between the pixel electrode element 21 and the counter electrode element 23, it is possible to transfer the signal charge generated in the photoelectric conversion element 22 into the pixel electrode element 21 and collect it.

Besides the single-layer structure, examples of the structure of the foregoing photoelectric conversion element include [1] a double-layer structure containing an electron transporting material layer and a hole transporting material layer from the side of the silicon substrate 1; and [2] a double-layer structure containing a hole transporting material layer and an electron transporting material layer from the side of the silicon substrate 1. Of these, the structure [2] is especially preferable because a high device performance is obtainable. Incidentally, each of the foregoing electron transporting material layer and the foregoing hole transporting material layer may be divided into two or more layers.

The case where the photoelectric conversion element is made of an organic material is especially effective in the present embodiment. For that reason, it is extremely desired to use an organic material as the electron transporting material and the hole transporting material. This is because the use of an organic material as the material of the photoelectric conversion element enables one to make it easy to adjust the spectral wavelength.

An $n^+$ type impurity layer 4 is formed at slight intervals adjacent to the left of the photoelectric conversion device 201 within the substrate 1. In a p-well layer between the $n^+$ layer 4 and the photoelectric conversion device 201, a charge read-out region TG for reading out a signal charge which has been emitted in the photoelectric conversion device 201 and stored in the n-layer 1 into the $n^+$ layer 4 is formed. In an upper portion of the charge read-out region TG, an electrode 7 made of polysilicon or the like is formed via the gate dielectric element 6. When a high voltage is applied to this electrode 7, the signal charge stored in the n-layer 1 is read out into the $n^+$ layer 4. On the $n^+$ layer 4, a wiring 9 made of a metal such as aluminum is formed; and in an upper portion of the wiring 9, a signal read-out circuit 13 composed of an MOS transistor for reading out a signal corresponding to the signal charge stored in the $n^+$ layer 4 is formed. The $n^+$ layer 4 and the signal read-out circuit 13 are connected to each other by the wiring 9. The electrode 7, the $n^+$ layer 4, the wiring 9 and the signal read-out circuit 13 configure the signal read-out part 202 as illustrated in FIG. 2.

An $n^+$ type impurity layer 5 and an $n^+$ type impurity layer 5' are formed at slight intervals adjacent to the right of the photoelectric conversion device 201 within the substrate 1. On the $n^+$ layer 5, a contact part 11 made of a metal is formed; and on the contact part 11, the pixel electrode element 16 is formed. The pixel electrode element 16 of the photoelectric conversion device 19 and the $n^+$ layer 5 are electrically connected to each other by this contact part 11. Thus, a signal charge collected in the pixel electrode element 16 is transferred into the $n^+$ layer 5 via the contact part 11 and stored therein. In addition, on the $n^+$ layer 5, a wiring 10 made of a metal such as aluminum is formed; and in an upper portion of the wiring 10, a signal read-out circuit 12 composed of an MOS transistor for reading out a signal corresponding to the signal charge stored in the $n^+$ layer 5 is formed. The $n^+$ layer 5 and the signal read-out circuit 12 are connected to each other by the wiring 10.

On the $n^+$ layer 5', a contact part 11' made of a metal is formed; and on the contact part 11', the pixel electrode element 21 is formed. The pixel electrode element 21 of the photoelectric conversion device 24 and the $n^+$ layer 5' are electrically connected to each other by this contact part 11'. Thus, a signal charge collected in the pixel electrode element 21 is transferred into the $n^+$ layer 5' via the contact part 11' and stored therein. In addition, on the $n^+$ layer 5', a wiring 10' made of a metal such as aluminum is formed; and in an upper portion of the wiring 10', a signal read-out circuit 12' composed of an MOS transistor for reading out a signal corresponding to the signal charge stored in the $n^+$ layer 5' is formed. The $n^+$ layer 5' and the signal read-out circuit 12' are connected to each other by the wiring 10'.

The $n^+$ layers 5 and 5', the wirings 10 and 10', the contact parts 11 and 11' and the signal read-out circuits 12 and 12' configure the signal read-out part 203 as illustrated in FIG. 2. As illustrated in FIG. 2, the signal read-out parts 202 and 203 are formed in a position where they do not overlap with the photoelectric conversion device 201 in top view. The electrode 7, the wirings 9, 10 and 10', the contact parts 11 and 11' and the signal read-out circuits 12, 12' and 13 are buried in the dielectric elements 6, 8, 14 and 15, respectively. In the dielectric element 8, a non-illustrated light-shielding element is formed on the $n^+$ layer 4, the electrode 7 and the $n^+$ layers 5 and 5', respectively. In the light-shielding element, an aperture is formed in an upper portion of the photoelectric conversion device 201. A portion of the photoelectric conversion device 201 which can be seen from the aperture is a region as illustrated in FIG. 2, and this region is a light receiving region of the photoelectric conversion device 201.

Figure 5:
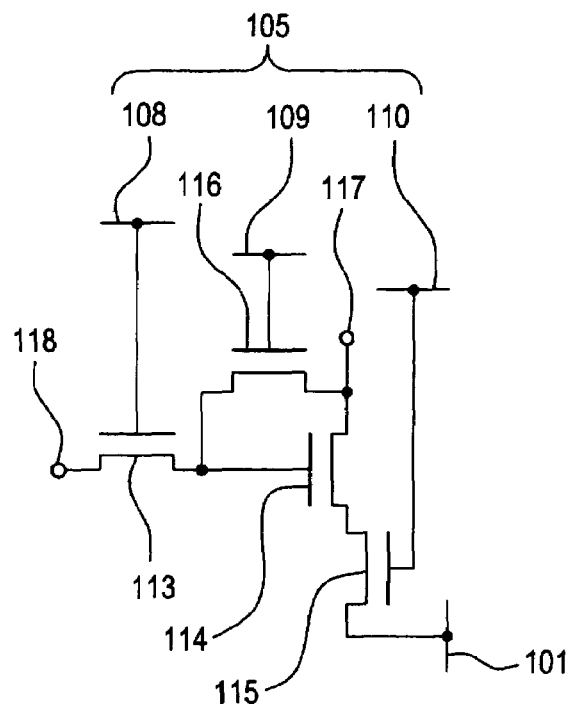
FIG. 5 is a view to show a circuit configuration example of a signal read-out circuit as illustrated in FIGS. 3 and 4.

Each of the signal read-out circuits 12, 12' and 13 is composed of a known four transistor configuration and has the same configuration. Accordingly, a circuit configuration of the signal read-out circuit 12 is described herein. FIG. 5 is a view to show a circuit configuration example of the signal read-out circuit 12. As illustrated in FIG. 5, the signal read-out circuit 12 is provided with a read-out transistor 113, an output transistor 114 for converting a signal charge into a color signal, a line-selection transistor 115 for selecting a pixel line, and a reset transistor 116 for resetting a signal charge.

In the read-out transistor 113, its gate is connected to a read-out signal line 108 included in a signal line 105; and its source is connected to an input terminal 118. In the output transistor 114, its gate is connected to a drain of the read-out transistor 113; and its source is connected to a power source terminal 117. In the reset transistor 116, its gate is connected to a reset signal line 109 included in the signal line 105; its source is connected is connected to the drain of the read-out transistor 113; and its drain is connected to the power source terminal 117. In the line-selection transistor 115, its gate is connected to a line-selection signal line 110 included in the signal line 105; its source is connected to a drain of the output transistor 114; and its drain is connected to the signal line 101.

In the light of the above, the solid-state imaging device as illustrated in FIG. 1 is configured to have numerous pixels having three photoelectric conversion devices of the in-substrate photoelectric conversion device 201, the on-substrate photoelectric conversion device 19 and the on-substrate photoelectric conversion device 24. In addition to the foregoing configuration, in the solid-state imaging device of the present embodiment, it is devised to enlarge a dynamic range by bringing a sensitivity difference in photoelectric conversion sensitivity among the respective three photoelectric conversion devices included in each pixel.

The terms "photoelectric conversion sensitivity among the photoelectric conversion devices" as referred to herein refer to a characteristic to show how much quantity of a signal can be extracted from a photoelectric conversion device when a prescribed quantity of light is made incident in the photoelectric conversion device. That is, it can be defined that when the same quantity of light is made incident, a photoelectric conversion device with high sensitivity having relatively high photoelectric conversion sensitivity has a larger quantity of a signal which can be extracted than a photoelectric conversion device with low sensitivity having relatively low photoelectric conversion sensitivity.

Since the photoelectric conversion device with high sensitivity is able to obtain many signals at a small quantity of light, it is optimum for photographing a subject with low illuminance. However, when a large quantity of light is made incident, since the signal is immediately saturated, the photoelectric conversion device with high sensitivity is not suitable for photographing a subject with high illuminance. Furthermore, since the photoelectric conversion device with low sensitivity is optimum for photographing a subject with high illuminance because even when a large quantity of light is made incident, so many signals are not obtainable. However, when a small quantity of light is made incident, since obtained signals are too small, the photoelectric conversion device with low sensitivity is not suitable for photographing a subject with low illuminance.

There has hitherto been known a measure for widening the dynamic range of a solid-state imaging device by synthesizing signals obtained from a photoelectric conversion device with low sensitivity and signals obtained from a photoelectric conversion device with high sensitivity. In the present embodiment, it is devised to enlarge the dynamic range by utilizing this matter.

In the present embodiment, in the pixel 100, the respective photoelectric conversion devices are designed so as to have a relationship of [(photoelectric conversion sensitivity of photoelectric conversion device 210)>(photoelectric conversion sensitivity of photoelectric conversion device 24)>(photoelectric conversion sensitivity of photoelectric conversion device 19)]. The photoelectric conversion sensitivity of each of the photoelectric conversion devices can be varied by adjusting a capacity of a portion to be connected to the input terminal 118 of each of the signal read-out circuits 12, 12' and 13. This can be understood from the matter that when this capacity is large, a gate voltage of the output transistor 114 hardly increases. That is, by making the capacity large to hardly increase the gate voltage of the output transistor 114, even when many signal charges are emitted in the photoelectric conversion device, it is possible to make the quantity of signals outputted from the output transistor 114 small and to make the photosensitive conversion sensitivity low. Conversely, by making the capacity small to easily increase the gate voltage of the output transistor 114, even when only a little of signal charges are emitted in the photosensitive conversion device, it is possible to make the quantity of signals outputted from the output transistor 114 and to make the photoelectric conversion sensitivity high.

The adjustment of the capacity of the portion to be connected to the input terminal 118 of each of the signal read-out circuits 12, 12' and 13 can be carried out by devising the structure of each photoelectric conversion device per se or can be realized by connecting the input terminal 118 to a capacitor.

A B signal with high sensitivity obtained from the photoelectric conversion device 201 for executing photoelectric conversion with high sensitivity, an R signal with low sensitivity obtained from the photoelectric conversion device 19 for executing photoelectric conversion with low sensitivity, and a G signal with middle sensitivity obtained from the photoelectric conversion device 24 for executing photoelectric conversion with middle sensitivity which is lower in photoelectric conversion sensitivity than the photoelectric conversion device 201 and higher in photoelectric conversion sensitivity than the photoelectric conversion device 19 are obtained from the thus designed pixel 100. However, when one pixel data is produced by only the signals obtained from the pixel 100, a good image is not obtainable. Then, in the solid-state imaging device of the present embodiment, it is intended to produce one pixel data by devising the configuration of each of the pixel 200 and the pixel 300 and using signals obtained from a unit composed of the pixels 100, 200 and 300.

The configuration of the pixel 200 is exactly the same as that of the pixel 100, except that the photoelectric conversion device 201 of the pixel 100 is a photoelectric conversion device for detecting light of a G wavelength region; that the photoelectric conversion device 19 of the pixel 100 is a photoelectric conversion device for detecting light of a B wavelength region; and that the photoelectric conversion device 24 of the pixel 100 is a photoelectric conversion device for detecting light of an R wavelength region.

The configuration of the pixel 300 is exactly the same as that of the pixel 100, except that the photoelectric conversion device 201 of the pixel 100 is a photoelectric conversion device for detecting light of an R wavelength region; that the photoelectric conversion device 19 of the pixel 100 is a photoelectric conversion device for detecting light of a G wavelength region; and that the photoelectric conversion device 24 of the pixel 100 is a photoelectric conversion device for detecting light of a B wavelength region.

Figure 6:
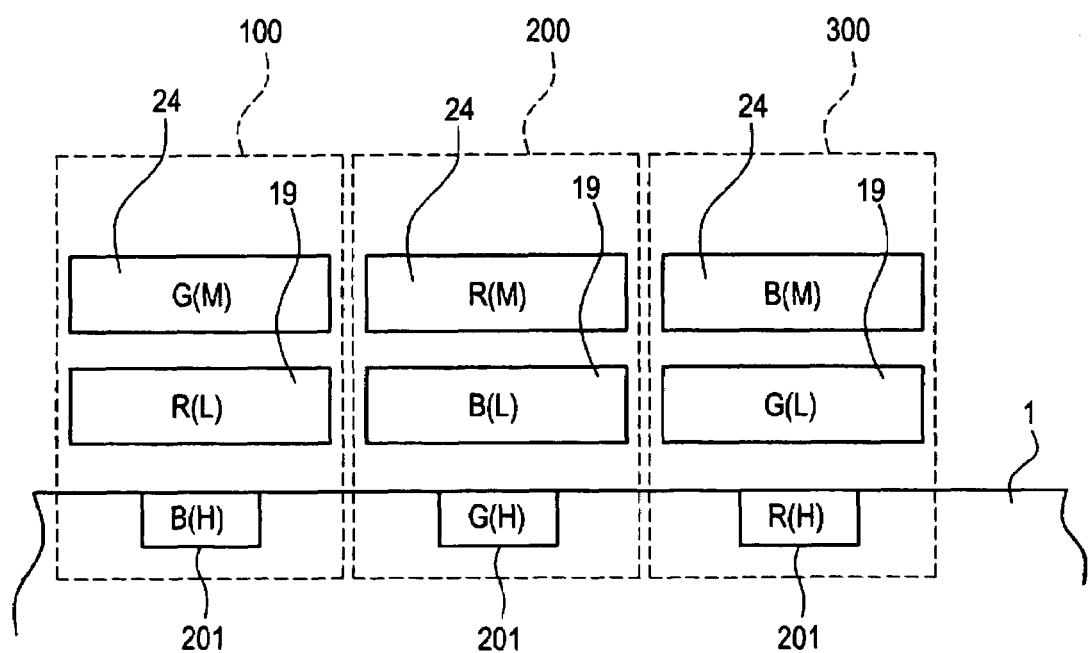
FIG. 6 is a C-C line sectional schematic view of FIG. 1.

FIG. 6 is an explanatory view that is easy to understand the foregoing configurations. FIG. 6 is a C-C line sectional schematic view of FIG. 1, namely a sectional schematic view of a unit composed of the pixels 100, 200 and 300. In FIG. 6, a photoelectric conversion device for executing photoelectric conversion with high sensitivity is designated as "(H)"; a photoelectric conversion device for executing photoelectric conversion with middle sensitivity is designated as "(M)"; and a photoelectric conversion device for executing photoelectric conversion with low sensitivity is designated as "(L)".

As is clear from FIG. 6, a B signal with high sensitivity, a G signal with middle sensitivity and an R signal with low sensitivity can be obtained from the pixel 100; a G signal with high sensitivity, an R signal with middle sensitivity and a B signal with low sensitivity can be obtained from the pixel 200; and an R signal with high sensitivity, a B signal with middle sensitivity and a G signal with low sensitivity can be obtained from the pixel 300. In other words, since the three signals with high sensitivity, middle sensitivity and low sensitivity are obtained for every color of R, G and B from one unit, by synthesizing these three signals for every color of R, G and B, it is possible to enlarge the dynamic range of the solid-state imaging device.

In the light of the above, in the case of a configuration of obtaining three signals of R, G and B from one pixel, in order to obtain three signals with high sensitivity, middle sensitivity and low sensitivity for every color and R, G and B from one unit, it is important that the adjacent photoelectric conversion devices to each other within one unit detect different light from each other as illustrated in FIG. 6.

Furthermore, the foregoing configuration is the most preferred example. Besides, the following configuration capable of largely shortening a manufacturing process is, as a matter of course, included in the invention. That is, this configuration is a configuration in which the on-substrate photoelectric conversion device is configured of a single device; the spectral wavelength of the on-substrate photoelectric device is defined into three colors of B, G and R; and the spectral wavelength of the in-substrate photoelectric device is respectively defined into yellow, magenta and cyan corresponding to these B, G and R. In this case, it is also preferable that the photoelectric conversion sensitivity of the on-substrate photoelectric conversion device is low, whereas the photoelectric conversion sensitivity of the in-substrate photoelectric conversion device is high. As a matter of course, in this case, by defining the spectral sensitivity of the on-substrate photoelectric conversion device into yellow, magenta and cyan, the in-substrate photoelectric conversion device can be made blue, green and red, respectively corresponding thereto. Besides, an arbitrary combination of colors may be employed.

When it is designed to enlarge the dynamic range by image synthesis by a related-art single plate type image sensor, in order to produce one pixel data, nine photosensitive devices for obtaining three signals with high sensitivity, middle sensitivity and low sensitivity for every color of R, G and B are required to be provided within a silicon substrate. On the other hand, according to the solid-state imaging device of FIG. 1, only three photoelectric conversion devices are required to be provided within a silicon substrate for the purpose of producing one pixel data. For that reason, it is possible to improve the dynamic range without causing a lowering of the resolution.

Concretely, the invention is able to realize a dynamic range of 70 dB or more, preferably 90 dB or more, and more preferably 120 dB or more, to widen an illuminance region by three digits or more as compared with a solid-state imaging device which has hitherto been put into practical use and to enhance the dynamic range which has been considered to be only inferior to a silver salt photosensitive material to an equal level.

Since the solid-state imaging device which has been described previously also has the characteristic features described in JP-A-58-103165, Japanese Patent No. 3405099 and JP-A-2002-83946, it is possible to achieve photographing with a higher image quality than that of a single plate type image sensor.

Figure 7:
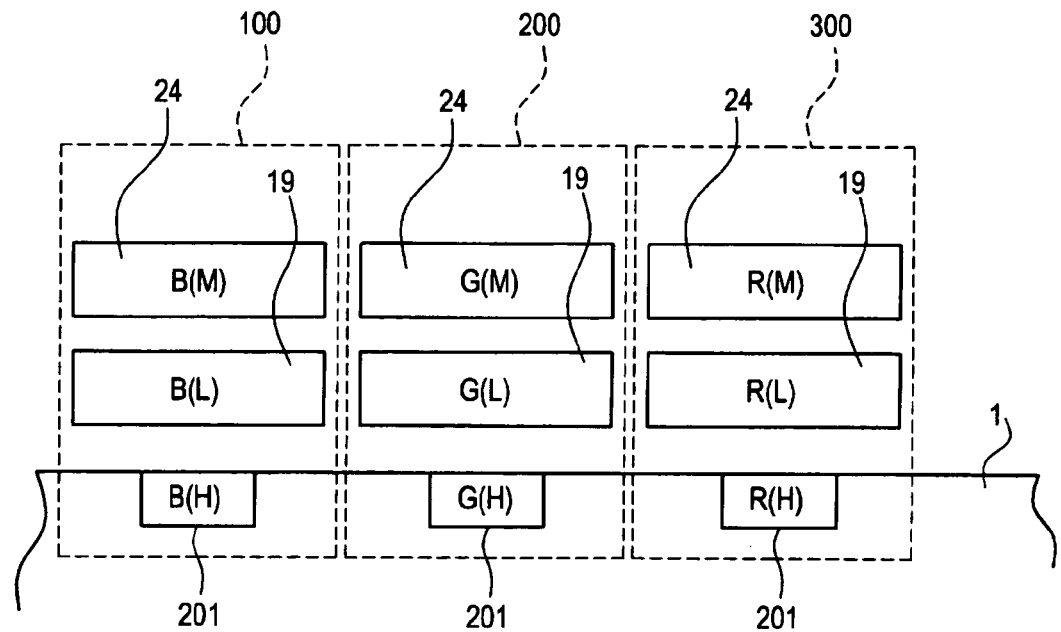
FIG. 7 is a modified view of a C-C line sectional schematic view of FIG. 1.
Figure 8:
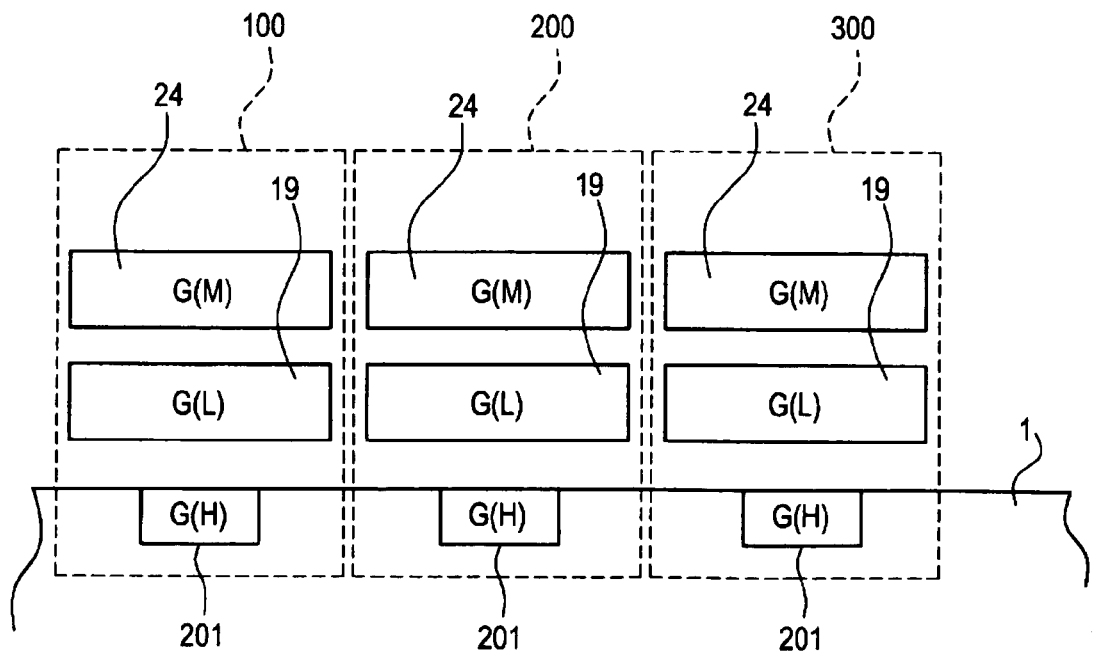
FIG. 8 is a modified view of a C-C line sectional schematic view of FIG. 1.

Incidentally, the effect for enlarging the dynamic range which has been described previously can also be obtained even in the case where the pixels 100, 200 and 300 are configured as illustrated in FIGS. 7 and 8.

A solid-state imaging device as illustrated in FIG. 7 is different from the solid-state imaging device as illustrated in FIG. 6 only at a point that each photoelectric conversion device to be included in the pixel 100 is a photoelectric conversion device for detecting light of a B wavelength region; that each photoelectric conversion device to be included in the pixel 200 is a photoelectric conversion device for detecting light of a G wavelength region; and that each photoelectric conversion device to be included in the pixel 300 is a photoelectric conversion device for detecting light of an R wavelength region, namely a point that the pixel 100 is a red pixel for detecting B light; that the pixel 200 is a red pixel for detecting G light; and that the pixel 300 is a red pixel for R light.

As is clear from FIG. 7, a B signal with high sensitivity, a B signal with middle sensitivity and a B signal with low sensitivity can be obtained from the pixel 100; a G signal with high sensitivity, a G signal with middle sensitivity and a G signal with low sensitivity can be obtained from the pixel 200; and an R signal with high sensitivity, an R signal with middle sensitivity and an R signal with low sensitivity can be obtained from the pixel 300. The signals obtained from the solid-state device having the configuration as illustrated in FIG. 7 are the same as signals obtained a single plate type solid-state imaging device in which a color filter array is a lateral stripe array. For that reason, by executing known signal processing, it is possible to enlarge the dynamic range of the solid-state imaging device. In the case of employing the configuration as illustrated in FIG. 7, even when the photoelectric conversion device 19 or the photoelectric conversion device 24 is omitted, color photographing can be achieved without causing a trouble. Also, in the case of employing the configuration as illustrated in FIG. 7, the photoelectric conversion elements which are included in the photoelectric conversion device 19 and the photoelectric conversion device 24 can be made common over all of the pixels.

Incidentally, in the example of FIG. 7, with respect to the array of the respective pixels, any array may be employed so far as an image data can be produced. For example, there may be employed a configuration in which the pixel 100, the pixel 200 and the pixel 300 are arrayed in a longitudinal stripe state; and a configuration in which a ratio of the number of the pixels 100 to the number of the pixels 200 to the number of the pixels 300 is 1/2/1 and these pixels 100, 200 and 300 are arrayed in a Bayer array. Of these, the Bayer array is especially preferable.

A solid-state imaging device as illustrated in FIG. 8 is different from the solid-state imaging device as illustrated in FIG. 6 only at points that all of the photoelectric conversion devices included in each of the pixels 100, 200 and 300 are a photoelectric conversion device for detecting light of a G wavelength region and that one pixel data is produced by using signals obtained from one pixel but not signals obtained from one unit.

As is clear from FIG. 8, a G signal with high sensitivity, a G signal with middle sensitivity and a G signal with low sensitivity can be obtained from the pixels 100, 200 and 300, respectively. For that reason, by using G signals obtained from the respective pixels, it is possible to enlarge the dynamic range of a solid-state device capable of achieving only monochromic photographing. In the case of employing the configuration as illustrated in FIG. 8, even when the photoelectric conversion device 19 or the photoelectric conversion device 24 is omitted, monochromic photographing can be achieved without causing a trouble. Also, in the case of employing the configuration as illustrated in FIG. 8, the photoelectric conversion elements which are included in the photoelectric conversion device 19 and the photoelectric conversion device 24 can be made common over all of the pixels.

Incidentally, while the configuration in which in the respective pixels of the solid-state imaging device, the photoelectric conversion device 201 is a photoelectric conversion device with high sensitivity, the photoelectric conversion device 19 is a photoelectric conversion device with low sensitivity and the photoelectric conversion device 24 is a photoelectric conversion device with middle sensitivity has been described, it should not be construed that the invention is limited thereto. In order to achieve the purpose of enlarging the dynamic range of the solid-state imaging device, it is better to provide a sensitivity difference among the respective photoelectric conversion devices included in each pixel. For example, there may be employed a configuration in which the photoelectric conversion device 201 is a photoelectric conversion device with low sensitivity, the photoelectric conversion device 19 is a photoelectric conversion device with middle sensitivity and the photoelectric conversion device 24 is a photoelectric conversion device with high sensitivity.

However, the most preferred embodiment is the configuration as illustrated in FIG. 6 in which the photoelectric conversion sensitivity of the photoelectric conversion device 201 present within the silicon substrate 1 is higher than that of each of the photoelectric conversion devices 19 and 24 present in an upper portion of the silicon substrate 1. Since a signal with high sensitivity obtained from a photoelectric conversion device having high photoelectric conversion sensitivity is deteriorated in S/N, it is important to control a noise component. In the case of emitting a signal charge within a silicon substrate and reading out a signal corresponding to this signal charge, the noise component can be controlled to the lowest level. For that reason, by making the photoelectric conversion device 201 present within the silicon substrate have high photoelectric conversion sensitivity, it is possible to control the deterioration of S/N of a signal with high sensitivity obtained by the photoelectric conversion device 201 to the minimum. The reason why the foregoing embodiment is the most preferable is hereunder described.

One of major reasons why the related-art single plate type image sensor has gained great success resides in the matter that the S/N is high. In particular, in photographing a subject with low illuminance (hereinafter referred to as "at the time of photographing with low illuminance"), in order to obtain good S/N, a noise must be controlled to an extremely low level. The control of a noise can be achieved by emitting a photoelectron in the inside of single-crystal Si having a relatively low doping concentration and transferring and reading out its signal charge in the inside of single crystal Si. In particular, it is considered that a complete transfer type image sensor using a buried photodiode is free from influences due to defect level of the surface and is extremely good in S/N with low illuminance. For that reason, to make the photoelectric conversion sensitivity of the in-substrate photoelectric conversion device 201 high is preferable in controlling the deterioration of S/N.

In the on-substrate photoelectric conversion devices 19 and 24, the silicon substrate 1 is provided with high-concentration doping layers $n^+$ 5 and 5' corresponding thereto for the convenience of wiring of electrodes. For that reason, in the case of making the photoelectric conversion sensitivity of the photoelectric conversion device 19 or 24 high, the $n^+$ layers 5 and 5' connected to the photoelectric conversion devices 19 and 24 become a cause of a noise or an afterimage, thereby exerting an extremely large adverse influence upon S/N of a signal with high sensitivity.

Furthermore, an influence of the capacity due to a structural cause of the on-substrate photoelectric conversion devices 19 and 24 is also important. In the case of the structures as illustrated in FIGS. 3 and 4, when the capacity for converting a signal charge to a potential within the silicon substrate 1 is defined as "C (read-out)" and the capacity of each of the photoelectric conversion devices 19 and 24 is defined as "C", a change in potential when a signal charge emitted in each of the photoelectric conversion devices 19 and 24 is changed ΔQ is substantially in inverse proportion to [C+C (read-out)]. That is, the larger the C, the smaller the change in potential which varies against the same change in signal charge is. Thus, it is meant that in the case of amplifying a signal by the output transistor 114 with the same gain in each of the photoelectric conversion device 19 and the photoelectric conversion device 24, the larger the C, the smaller the gain is. Moreover, a lowering of this gain cannot be compensated by lowering the C (read-out). This is because the change in potential is in inverse proportion to [C+C (read-out)], and the C is sufficiently larger than the C (read-out). As illustrated in FIGS. 3 and 4, since each of the on-substrate photoelectric conversion devices 19 and 24 is composed of a photoelectric conversion element and two plate type electrodes interposing the photoelectric conversion element therebetween, a value of the C is large in view of the structure. When a hole transporting organic material and an electron transporting organic material are used as the photoelectric conversion element, the subject value becomes especially large. Whatever a bias of the counter electrodes 18 and 23 is changed, though an extraction efficiency of the signal charge increases, the gain is not influenced. Thus, the C due to a structural cause of the on-substrate photoelectric conversion devices 19 and 24 largely lowers the gain. In view of the structure, it is very common that the gain becomes not more than 1/10.

According to *ITE Technical Report*, Vol. 27, No. 25, pages 21 to 24 and *ITE Technical Report*, Vol. 27, No. 59, pages 21 to 24, it is known that in a single plate type image sensor, when a signal charge emitted in a photoelectric conversion device is subjected to amplification with high gain at an initial stage (stage before a column amplifier), S/N at the time of photographing with low illuminance of an image sensor thereof can be improved. That is, in the solid-state imaging device as illustrated in FIG. 1, even when the on-substrate photoelectric conversion device 19 or 24 is a photoelectric conversion device with high sensitivity, if in the signal read-out circuit 12 or 12', a signal can be subjected to amplification with high gain, the S/n of a signal with high sensitivity can be improved. However, since the solid-state imaging device described in the present embodiment largely loses a gain in view of the structure, a loss of the gain must be gained somewhere. Usually, since the output transistor 114 requires linearity, the output transistor 114 is designed so as to form a source follower circuit with a gain of about 0.8, a value of which is substantially the maximum. Therefore, the gain cannot be recovered by the output transistor 114. Though it might be thought to recover the gain by the column amplifier 103, it is unreasonable to increase a gain of 10 times or more by a one-stage amplification circuit. This is because when a gain of an analog circuit is increased 10 times or more, any one of performances such as consumed power, linearity and noise is deteriorated, resulting in a lowering of the total performance almost certainly.

That is, in the solid-stage imaging device having the configuration which has been described previously, when the on-substrate photoelectric conversion device 19 or 24 is a photoelectric conversion device with high sensitivity, it is difficult to prevent the deterioration of S/N. On the other hand, the in-substrate photoelectric conversion device 201 within the silicon substrate 1 is good in S/N at the time of photographing with low illuminance in view of the structure. For that reason, it is the most suitable that a photoelectric conversion device for executing photoelectric conversion with high sensitivity in which the deterioration of S/N is of a problem is provided within the silicon substrate 1 as in the present embodiment; and it is the most preferable that the in-substrate photoelectric conversion device 201 is a photoelectric conversion device with high sensitivity.

Incidentally, when an object of improving the S/N at the time of photographing with low illuminance is concerned, if the photoelectric conversion sensitivity which is to be brought in the in-substrate photoelectric conversion device 201 is high, it does not matter that the photoelectric conversion sensitivity which is to be brought in either the on-substrate photoelectric conversion device 19 or the on-substrate photoelectric conversion device 24 is high so far as it is lower than the photoelectric conversion sensitivity of the in-substrate photoelectric conversion device 201. However, in order to make the efficiency for utilizing light optimum, it is preferable that the on-substrate photoelectric conversion device closer to the substrate 1 has lower photoelectric conversion sensitivity as in the configurations as illustrated in FIGS. 6 to 8. This is because the on-substrate photoelectric conversion device closer to the substrate 1 has a lower quantity of incident light.

Furthermore, as illustrated in FIGS. 6 to 8, in the case where plural on-substrate photoelectric conversion devices are included in each pixel, it is preferable in view of optimizing the efficiency for utilizing light that the photoelectric conversion element closer to the silicon substrate 1 has a higher external quantum efficiency. So far as the examples of FIGS. 6 to 8 are concerned, it is preferable that the external quantum efficiency of the photoelectric conversion element 17 of the photoelectric conversion device 19 is higher than the external quantum efficiency of the photoelectric conversion element 22 of the photoelectric conversion device 24.

In the light of the above, though one pixel of the solid-state imaging device described in the present embodiment is configured to have three photoelectric conversion devices of two photoelectric conversion devices stacked in an upper portion of a silicon substrate and one photoelectric conversion device formed within the silicon substrate, it is better that the one pixel includes plural photoelectric conversion devices of at least one in-substrate photoelectric conversion device and at least one on-substrate photoelectric conversion device. In the case of forming plural photoelectric conversion devices within the silicon substrate, the plural photoelectric conversion devices may be formed such that they are arrayed on the same plane within the silicon substrate. Also, as in a device described in JP-T-2002-513145, the plural photoelectric conversion devices may be stacked in a depth direction within the silicon substrate.

In all of these configurations, by providing a sensitivity difference in photoelectric conversion sensitivity among the plural photoelectric conversion devices, it is possible to devise to enlarge the dynamic range. Also, by making the photoelectric conversion sensitivity of the photoelectric conversion device present within the silicon substrate higher than the photoelectric conversion sensitivity of the photoelectric conversion devices present in an upper portion of the silicon substrate, it is possible to obtain good S/N.

Incidentally, in the solid-state imaging device which has been described previously, in one pixel, when an area (light receiving area) of the light receiving region of the in-substrate photoelectric conversion device 201 in top view is 20% or more and not more than 90% of a light receiving area of the light receiving region of each of the on-substrate photoelectric conversion devices 19 and 24 in top view, it is possible to effectively reduce shading. This area ratio is preferably in the range of 40% or more and not more than 90%, more preferably 50% or more and not more than 80%, and further preferably 60% or more and not more than 80%. The "shading" as referred to herein means a phenomenon wherein a photographing performance is largely different between the periphery and the center of the solid-state imaging device. With respect to the shading, in the case where the foregoing area ratio is small, the sensitivity performance may possibly be different at the time of photographing with low illuminance, whereas in the case where the area ratio is too large, the color may possibly be blurred. Therefore, the foregoing range is preferable.

Furthermore, in one pixel, when a deviation between the center of the light receiving region of the in-substrate photoelectric conversion device 201 in top view and the center of the light receiving region of each of the on-substrate photoelectric conversion devices 19 and 24 in top view is not more than 30% of a width of the light receiving region of each of the on-substrate photoelectric conversion devices 19 and 24 in a line direction or a row direction, this phenomenon is more suppressed. This deviation is more preferably not more than 20%, and further preferably not more than 10%. It is the most preferable that the centers are coincident with each other.

A preferred embodiment regarding the on-substrate photoelectric conversion device in the invention is hereunder described.

With respect to materials of the pixel electrode element and the counter electrode element, any material is basically useful. For example, metals, alloys, metal oxides, organic conducting compounds, and mixtures thereof are suitable. Specific examples thereof include arbitrary combinations selected among Li, Na, Mg, K, Ca, Rb, Sr, Cs, Ba, Fr, Ra, Sc, Ti, Y, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Al, Ga, In, Tl, Si, Ge, Sn, Pb, P, As, Sb, Bi, Se, Te, Po, Br, I, At, B, C, N, F, O, S, and N. In the invention, Al, Pt, W, Au, Ag, Ta, Cu, Cr, Mo, Ti, Ni, Pb, and Zn can be especially preferably selected. Of these, a configuration with high transmittance is preferable.

That is, it is very preferred to use a transparent electrode. Specific examples of thin semi-transmitting electrodes prepared by using a conducting metal oxide (for example, tin oxide, zinc oxide, indium oxide, indium zinc oxide (ITO), and indium tin oxide (ITO)) or a metal (for example, gold, platinum, silver, chromium, and nickel); mixtures or stacks of such metal and conducting metal oxide; inorganic conducting substances (for example, copper iodide and copper sulfide); organic conducting materials (for example, polyaniline, polythiophene, and polypyrrole); and stacks thereof with ITO. Also, materials described in detail in *New Developments of Transparent Conducting Films*, supervised by Yutaka Sawada (published by CMC Publishing Co., Ltd., 1999); *Technologies of Transparent Conducting Films*, written by Japan Society for the Promotion of Science (published by Ohmsha, Ltd., 1999); and so on may be used. However, in the invention, substances containing any one material of ITO, IZO, $SnO_2$, ATO, ZnO, $TiO_2$, and FTO are especially preferable.

Preferred examples of the configuration of the on-substrate photoelectric conversion device include [1] a configuration of a pixel electrode element, an electron transporting material layer, a hole transporting material layer, and a counter electrode element in this order from the side of the substrate; and [2] a configuration of a pixel electrode element, a hole transporting material element, an electron transporting material element, and a counter electrode element in this order from the side of the substrate. However, it should not be construed that the invention is limited thereto. For example, the electron transporting material layer may be divided into two or more layers; and the hole transporting material layer may be divided into two or more layers. Examples thereof include [3] a configuration of a pixel electrode element, an electron transporting material layer, an electron transporting material layer, a hole transporting material layer, and a counter electrode element in this order from the side of the substrate; [4] a configuration of a pixel electrode element, an electron transporting material layer, a hole transporting material layer, a hole transporting material layer, and a counter electrode element in this order from the side of the substrate; and [5] a configuration of a pixel electrode element, an electron transporting material layer, an electron transporting material layer, a hole transporting material layer, a hole transporting material layer, and a counter electrode element in this order from the side of the substrate. In addition, in the case where two on-substrate photoelectric conversion devices are stacked on the substrate, a combination of the case where one on-substrate photoelectric conversion device is present can be basically prepared. That is, examples thereof include a configuration of a pixel electrode element, an electron transporting material layer, a hole transporting material layer, a counter electrode element, an interlayer dielectric element, a pixel electrode element, an electron transporting material layer, a hole transporting material layer, and a counter electrode element in this order from the side of the substrate, which configuration is corresponding to a combination of [1] and [1]; and a configuration of a pixel electrode element, an electron transporting material layer, a hole transporting material layer, a counter electrode element, an interlayer dielectric element, a pixel electrode element, a hole transporting material layer, an electron transporting material layer, and a counter electrode element in this order from the side of the substrate, which configuration is corresponding to a combination of [1] and [2]. Such a configuration of plural layers may be basically configured by an arbitrary combination selected among [1], [2], [3], [4] and [5] or may be configured by an arbitrary combination of other configuration than [1], [2], [3], [4] and [5] with [1], [2], [3], [4] or [5].

Furthermore, while the material of the photoelectric conversion element in the invention may be an organic material or an inorganic material, the case of containing an organic material can be preferably employed in the invention. The case of containing a hole transporting organic material and an electron transporting organic material is extremely desirable. As the electron transporting organic material in the invention, for example, an acceptor type organic semiconductor (compound) can be preferably used. The "acceptor type organic semiconductor (compound)" as referred to herein is mainly represented by an electron transporting organic compound and is an organic compound having properties such that it is liable to accept an electron. In more detail, when two organic materials are used in a contact state, an organic compound having a larger electron affinity is referred to as the acceptor type organic semiconductor (compound). Accordingly, as the acceptor type organic compound, any organic compound having electron accepting properties is useful. Examples thereof include fused aromatic carbocyclic compounds (for example, naphthalene derivatives, anthracene derivatives, phenanthrene derivatives, tetracene derivatives, pyrene derivatives, perylene derivatives, and fluoranthene derivatives); 5- to 7-membered heterocyclic compound containing a nitrogen atom, an oxygen atom or a sulfur atom (for example, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyralidine, pyrropyridine, thiadiazolopyridine, dibenzazepine, and tribenzazepine); polyarylene compounds; fluorene compounds; cyclopentadiene compounds; silyl compounds; and metal complexes containing, as a ligand, a nitrogen-containing heterocyclic compound. However, it should not be construed that the invention is limited thereto. Any organic compound having a larger electron affinity than the organic compound used as a donor type organic compound may be used as the acceptor type organic semiconductor.

Furthermore, especially preferred examples of the hole transporting organic material in the invention are as follows. For example, there can be used poly-N-vinylcarbazole derivatives, polyphenylene vinylene derivatives, polyphenylene, polythiophene, polymethylphenylsilane, polyaniline, triazole derivatives, oxadiazole derivatives, imidazole derivatives, polyarylalkane derivatives, pyrazoline derivatives and pyrazolone derivatives, phenylenediamine derivatives, arylamine derivatives, amino-substituted chalcone derivatives, oxazole derivatives, carbazole derivatives, styrylanthracene derivatives, fluororenone derivatives, hydrazone derivatives, stilbene derivatives, porphyrin derivatives (for example, phthalocyanine), aromatic tertiary amine compounds and styrylamine compounds, butadiene compounds, benzidine derivatives, polystyrene derivatives, triphenylmethane derivatives, tetraphenylbenzine derivatives, and starburst polyamine derivatives. It is also very preferred to use an organic dye; and it is preferred to bring the foregoing material with a structure capable of absorbing light. Besides, metal complex dyes, cyanine based dyes, a merocyanine based dyes, phenyl xanthene based dyes, triphenylmethane based dyes, rhodacyanine based dyes, xanthene based dyes, large cyclic aza-azulene based dyes, azulene based dyes, naphthoquinone based dyes, anthraquinone based dyes, cyclic compounds fused with a fused polycyclic aromatic or aromatic and/or heterocyclic compound such as anthracene and pyrene, and dyes analogous cyanine based dyes bound to two nitrogen-containing heterocyclic rings such as quinoline, benzothazole, and benzoxazole, a squarylium group or a croconic methine group can be preferably used. In the case of a metal complex dye, dithiol metal complex based dyes, metal phthalocyanine dyes, metal porphyrin dyes, and ruthenium complex dyes are preferable, with ruthenium complex dyes being especially preferable. Examples of the ruthenium complex dyes include complex dyes described in U.S. Pat. Nos. 4,927,721, 4,684,537, 5,084,365, 5,350,644, 5,463,057 and 5,525,440, JP-A-7-249790, JP-T-10-504512, WO 98/50393, JP-A-2000-26487, and so on. Specific examples of polymethine dyes such as cyanine dyes, merocyanine dyes, and squarylium dyes include dyes described in JP-A-11-35836, JP-A-11-67285, JP-A-11-86916, JP-A-11-97725, JP-A-11-158395, JP-A-11-163378, JP-A-11-214730, JP-A-11-214731, JP-A-11-238905, JP-A-2000-26487, European Patents Nos. 892411, 911841 and 991092, and so on.

Incidentally, these materials may be contained in a polymer binder as the need arises. Examples of such a polymer binder include polyvinyl chloride, polycarbonates, polystyrenes, polymethyl methacrylate, polybutyl methacrylate, polyesters, polysulfones, polyphenylene oxide, polybutadiene, hydrocarbon resins, ketone resins, phenoxy resins, polyamides, ethyl cellulose, polyvinyl acetate, ABS resins, polyurethane, melamine resins, unsaturated polyesters, alkyd resins, epoxy resins, silicon resins, polyvinyl butyral, and polyvinyl acetal.

This application is based on Japanese Patent application JP 2006-15407, filed Jan. 24, 2006, the entire content of which is hereby incorporated by reference, the same as if set forth at length.

What is claimed is:

1. A solid-state imaging device comprising a plurality of pixels arrayed on a plane, wherein
    each of the pixels includes a semiconductor substrate and a plurality of photoelectric conversion devices,
    the plurality of photoelectric conversion devices include at least one on-substrate photoelectric conversion device stacked in an upper portion of the semiconductor substrate and at least one in-substrate photoelectric conversion device provided within the semiconductor substrate in a lower portion of the on-substrate photoelectric conversion device, and
    the plurality of photoelectric conversion devices have a different photoelectric conversion sensitivity from each other.

2. The solid-state imaging device according to claim 1, wherein the in-substrate photoelectric conversion device has a photoelectric conversion sensitivity higher than a photoelectric conversion sensitivity of the on-substrate photoelectric conversion device.

3. The solid-state imaging device according to claim 2,
    wherein the plurality of photoelectric conversion devices include at least two on-substrate photoelectric devices stacked in an upper portion of the semiconductor substrate, and
    in the at least two on-substrate photoelectric devices, the on-substrate photoelectric conversion device closer to the semiconductor substrate has lower photoelectric conversion sensitivity.

4. The solid-state imaging device according to claim 1, wherein a wavelength region of light to be detected is different among the plurality of photoelectric conversion devices.

5. The solid-state imaging device according to claim 4, wherein
    the plurality of photoelectric conversion devices are two on-substrate photoelectric conversion devices stacked in an upper portion of the semiconductor substrate and one in-substrate photoelectric conversion device provided within the semiconductor substrate in a lower portion of the on-substrate photoelectric conversion devices, and
    lights of red, green and blue wavelength regions are detected by the two on-substrate photoelectric conversion devices and the one in-substrate photoelectric conversion device.

6. The solid-state imaging device according to claim 4, wherein
    the plurality of pixels are divided into units each made of a plurality of pixels, and
    the adjacent on-substrate photoelectric conversion devices within the unit detect light of a different wavelength region from each other, and the adjacent in-substrate photoelectric conversion devices within the unit detect light of a different wavelength region from each other.

7. The solid-state imaging device according to claim 1, wherein
    each of the plurality of photoelectric conversion devices of a single pixel detects light of a same wavelength region,
    the plurality of pixels include a red pixel provided with the plurality of photoelectric conversion devices for detecting light of a red wavelength region, a green pixel provided with the plurality of photoelectric conversion devices for detecting light of a green wavelength region, and a blue pixel provided with the plurality of photoelectric conversion devices for detecting light of a blue wavelength region, and
    a ratio of a number of the red pixels to a number of the green pixels to a number of the blue pixels included in the solid-state imaging device is 1/2/1.

8. The solid-state imaging device according to claim 1, wherein
    the plurality of photoelectric conversion devices include at least two on-substrate photoelectric conversion devices stacked in an upper portion of the semiconductor substrate, each of the on-substrate photoelectric conversion devices including a photoelectric conversion element, and
    in the at least two photoelectric conversion elements, the photoelectric conversion element closer to the semiconductor substrate has a higher external quantum efficiency.

9. The solid-state imaging device according to claim 8, wherein the on-substrate photoelectric conversion device includes a pair of electrodes and the photoelectric conversion element provided between the electrodes.

10. The solid-state imaging device according to claim 1, wherein the on-substrate photoelectric conversion device includes a pair of electrodes and a photoelectric conversion element provided between the electrodes.

11. The solid-state imaging device according to claim 8, wherein the photoelectric conversion element contains an organic material.

12. The solid-state imaging device according to claim 11, wherein the organic material contains a hole transporting organic material and an electron transporting organic material.

13. The solid-state imaging device according to claim 12, wherein the hole transporting organic material and the electron transporting organic material are provided so that the semiconductor substrate, the hole transporting organic material and the electron transporting organic material are in this order.

14. The solid-state imaging device according to claim 1, wherein in one pixel, a light receiving area of the in-substrate photoelectric conversion device in top view is from 20% to 90% of a light receiving area of the on-substrate photoelectric conversion device in top view.

15. The solid-state imaging device according to claim 1, wherein in one pixel, a deviation between a center of a light receiving region of the in-substrate photoelectric conversion device in top view and a center of a light receiving region of the on-substrate photoelectric conversion device in top view is not more than 30% of a width of the light receiving region of the on-substrate photoelectric conversion device.

16. The solid-state imaging device according to claim 3, wherein
the plurality of pixels are divided into units each made of a plurality of pixels, and
the adjacent on-substrate photoelectric conversion devices within the unit detect light of a different wavelength region from each other, and the adjacent in-substrate photoelectric conversion devices within the unit detect light of a different wavelength region from each other.

17. The solid-state imaging device according to claim 16, wherein, in each pixel within the unit, the photoelectric conversion sensitivity of the in-substrate photoelectric conversion device is high, the photoelectric conversion sensitivity of the on-substrate photoelectric conversion device further from the semiconductor substrate is medium, and the photoelectric conversion sensitivity of the on-substrate photoelectric conversion device closer to the semiconductor substrate is low, with respect to each other.

18. The solid-state imaging device according to claim 17, wherein each color of red, green and blue light is detected in a single pixel in a different photoelectric conversion device at a different photoelectric sensitivity.

19. The solid-state imaging device according to claim 18, wherein each wavelength region detected within the unit is detected at a different photoelectric conversion sensitivity.

20. The solid-state imaging device according to claim 16, wherein adjacent photoelectric conversion devices are adjacent within a same pixel depth.

21. The solid-state imaging device according to claim 5, wherein, in each pixel, the photoelectric conversion sensitivity of the in-substrate photoelectric conversion device is high, the photoelectric conversion sensitivity of the on-substrate photoelectric conversion device further from the semiconductor substrate is medium, and the photoelectric conversion sensitivity of the on-substrate photoelectric conversion device closer to the semiconductor substrate is low, with respect to each other.

22. The solid-state imaging device according to claim 21, wherein each color of red, green and blue light is detected in a single pixel in a different photoelectric conversion device at a different photoelectric sensitivity.

23. The solid-state imaging device according to claim 22, wherein each photoelectric conversion device in a single pixel detects only one of the red, green and blue wavelength regions.

24. The solid-state imaging device according to claim 6, wherein, in each pixel within the unit, a photoelectric conversion sensitivity of the in-substrate photoelectric conversion device is higher than a photoelectric conversion sensitivity of the on-substrate photoelectric conversion device.

25. The solid-state imaging device according to claim 24, wherein each wavelength region detected within the unit is detected at a different photoelectric conversion sensitivity.

26. The solid-state imaging device according to claim 1, wherein a photoelectric conversation sensitivity is a sensitivity measurement correlated to a quantity of a signal which is extracted from each of the plurality of photoelectric conversion devices according to a prescribed quantity of light made incident in each of the plurality of photoelectric conversion devices.

27. The solid-state imaging device according to claim 19, wherein a photoelectric conversation sensitivity is a sensitivity measurement correlated to a quantity of a signal which is extracted from each of the plurality of photoelectric conversion devices according to a prescribed quantity of light made incident in each of the plurality of photoelectric conversion devices.

28. The solid-state imaging device according to claim 23, wherein a photoelectric conversation sensitivity is a sensitivity measurement correlated to a quantity of a signal which is extracted from each of the plurality of photoelectric conversion devices according to a prescribed quantity of light made incident in each of the plurality of photoelectric conversion devices.

29. The solid-state imaging device according to claim 25, wherein a photoelectric conversation sensitivity is a sensitivity measurement correlated to a quantity of a signal which is extracted from each of the plurality of photoelectric conversion devices according to a prescribed quantity of light made incident in each of the plurality of photoelectric conversion devices.

30. The solid-state imaging device according to claim 26, wherein when a same quantity of light is made incident in each of the plurality of photoelectric conversion devices, a first photoelectric conversion device having a higher photoelectric conversion sensitivity than the photoelectric conversion sensitivity of a second photoelectric conversion device has a larger quantity of the signal which can be extracted therefrom than can be extracted from the second photoelectric conversion device.

31. The solid-state imaging device according to claim 1, wherein the photoelectric conversion sensitivity refers to a characteristic to show how much quantity of a signal can be extracted from one of the photoelectric conversion devices when a prescribed quantity of light is made incident in the photoelectric conversion device.

32. The solid-state imaging device according to claim 1, wherein each of the plurality, of photoelectric conversion devices detect a light and generate a signal charge corresponding to the detected light.

33. The solid-state imaging device according to claim 32, wherein the signal charge generated by each on-substrate photoelectric conversion device is generated outside the substrate, and the signal charge generated by each in-substrate photoelectric conversion device is generated inside the substrate.

34. The solid-state imaging device according to claim 1, wherein the plurality of photoelectric conversion devices have a plurality of different photoelectric conversion sensitivities such that a dynamic range of the solid-state imaging device is increased.

35. The solid-state imaging device according to claim 1, wherein the photoelectric conversion sensitivity is a sensitivity measurement which applies to all colors of light similarly and is not a sensitivity to a specific wavelength region corresponding to a specific color.

36. The solid-state imaging device according to claim 16, wherein a signal having a high sensitivity, a signal having a medium sensitivity and a signal having a low sensitivity with respect to one another are generated for each color of red, green and blue such that three signals are generated for each color of red, green and blue for each unit.

37. The solid-state imaging device according to claim 1, wherein the different photoelectric conversion sensitivity of each of the plurality of photoelectric conversion devices is varied to be different from each other by adjusting a capacity to hold signal charges of a portion connected to an input terminal of a corresponding signal read-out circuit.

38. The solid-state imaging device according to claim 37, wherein the portion is the photoelectric conversion device connected to the input terminal of the corresponding signal read-out circuit.

39. The solid-state imaging device according to claim 37, wherein the portion is a capacitor connected between one of the photoelectric conversion devices and the input terminal of the corresponding signal read-out circuit.

40. The solid-state imaging device according to claim 1, wherein an arrangement of detected colors is not an arrangement of photoelectric conversion devices having different photoelectric sensitivities.

41. The solid-state imaging device according to claim 4, wherein the plurality of photoelectric conversion devices have the different photoelectric conversion sensitivity from each other regardless of the wavelength region of light to be detected.

* * * * *